United States Patent
Wang et al.

(10) Patent No.: US 7,999,696 B2
(45) Date of Patent: *Aug. 16, 2011

(54) ON-LINE WEB ACCESSED ENERGY METER

(75) Inventors: Wei Wang, Bronx, NY (US); Erran Kagan, Great Neck, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 770 days.

This patent is subject to a terminal disclaimer.

(21) Appl. No.: 11/998,920

(22) Filed: Dec. 3, 2007

(65) Prior Publication Data

US 2008/0088476 A1   Apr. 17, 2008

Related U.S. Application Data

(63) Continuation of application No. 10/969,706, filed on Oct. 20, 2004, now Pat. No. 7,304,586.

(51) Int. Cl.
*G08B 23/00* (2006.01)

(52) U.S. Cl. ............. 340/870.02; 702/61; 370/401; 340/870.03; 705/416; 455/445

(58) Field of Classification Search ........... 340/870.02, 340/870.03; 702/61; 370/401; 705/412; 455/445

See application file for complete search history.

(56) References Cited

U.S. PATENT DOCUMENTS

| | | | |
|---|---|---|---|
| 6,396,839 B1 | 5/2002 | Ardalan et al. | |
| 6,437,692 B1 | 8/2002 | Petite et al. | |
| 6,751,563 B2 | 6/2004 | Spanier et al. | |
| 6,900,738 B2 | 5/2005 | Crichlow | |
| 6,985,087 B2 | 1/2006 | Soliman | |
| 7,043,459 B2 | 5/2006 | Peevey | |
| 7,049,975 B2 | 5/2006 | Vanderah | |
| 7,050,808 B2 | 5/2006 | Janusz et al. | |
| 7,304,586 B2 * | 12/2007 | Wang et al. | 340/870.02 |

* cited by examiner

*Primary Examiner* — Albert K Wong

(74) *Attorney, Agent, or Firm* — Gerald E. Hespos; Michael J. Porco

(57) ABSTRACT

An electrical metering system capable of performing multiple metering functions, collecting data, and wirelessly provides the collected metering data to a utility operator. In the electrical metering system, at least one computing device for initiating a request for data. A first modem connects the computing device to an infrastructure. A wireless embedded modem for wirelessly connects an electric meter to an infrastructure, and the wireless electric modem receives a request from the computing device and wirelessly transmits the metering data to the computing device, thereby initiating the request.

34 Claims, 6 Drawing Sheets

ON-LINE WEB ACCESSED ENERGY METER

PRIORITY

This application is a continuation application of U.S. application Ser. No. 10/969,706, filed Oct. 20, 2004, entitled "ON-LINE WEB ACCESSED ENERGY METER", the contents of which are hereby incorporated by reference in their entirety.

BACKGROUND OF THE INVENTION

1. Field of the Invention

The present invention relates to utility revenue meters for measuring usage and quality of electrical power in an electrical power distribution network. In particular, the present invention relates to utility revenue meters that are connected to the Internet via wireless means.

2. Discussion of the Related Art

With proliferation of electrically powered devices and systems, there is an increasing need to accurately and precisely measure and monitor the quality of the electrical power supplying these devices and systems. Electric utility companies ("utilities") track electric usage by customers by using electrical energy meters. These meters track the amount of energy consumed at a particular location. These locations range from power substations, to commercial businesses, to residential homes. The electric utility companies use the energy meters to charge customers for their power consumption, i.e. revenue metering.

A popular type of energy meter is the socket-type energy meter. As its name implies, the meter itself plugs into a socket for easy installation, removal, and replacement. Other meter installations include panel mounted, switchboard mounted, and circuit breaker mounted. Typically the energy meter connects between utility power lines supplying electricity and a usage point, namely a residence or commercial place of business. Though not typical, an energy meter may also be placed at a point within the utility's power grid to monitor power flowing through that point for distribution, power loss, or capacity monitoring. Also, energy meters that handle submetering functions can be used to monitor internal customer usage.

Traditionally, energy meters used mechanical means to track the amount of consumed power. The inductive spinning disk energy meter is still commonly used. The spinning disk drives mechanical counters that track the power consumption information. Newer to the market are electronic energy meters based on solid-state microprocessor applications. Electronic meters have replaced the older mechanical meters, and utilize digital sampling of the voltage and current waveforms to generate power consumption information. In addition to monitoring power consumption, electronic meters can also monitor and calculate power quality, that is, voltage, current, real power, reactive power, apparent power, etc. These power quality measurements and calculations are displayed on an output display device on the meter.

While electrical utility companies currently use devices to measure the amount of electrical power used by both residential and commercial facilities and the quality of electrical power in an electrical power distribution network, these devices generally do not allow for readings to be made automatically via some remote means. The meter readings are collected in the same manner they were collected in the past, a person reads and reports the information displayed on the meter.

In more recent developments, limited power consumption information can be transmitted from the energy meter to the utility through the use of telephone communications circuitry contained either within or external to the meter. These developments are advantageous to the utility company in that they reduce the need for employees being dispatched to the remote locations to collect the power consumption information. A standard modem receives raw power consumption information from the energy meter and transmits the information to the utility company via telephone lines.

FIG. 1 illustrates a house or an institution 10 having a revenue meter 12 connected to a modem 14. The modem 14 is, in turn, connected to a telephone line 16. In the house or an institution 10, the telephone line 16 may be a dedicated line, i.e., only the modem 14 is connected to it, or a shared line, for example, with one or more telephones 18 connected to the same line 16 via a telephone jack 17. The telephone line 16 is connected to the telephone infrastructure or grid 28 being managed by a telephone company 26. Similarly, on the utility side, the utility company or a department entrusted to receive meter readings 20 includes at least one computer 22 connected to a modem 24, which is connected to the telephone line 16.

While this represents an improvement over past techniques, this method has proven to be costly and unreliable, as there is a need for dedicated telephone line connection and line maintenance, which is expensive. When equipment malfunctions an employee must be dispatched to determine the reason for the malfunction and then a specialist must be sent in to fix it. Therefore, there exists a need for a device, which can accurately, inexpensively, and timely provide measurements, e.g., power consumption information, recorded by a common energy or energy meter.

SUMMARY OF THE INVENTION

It is therefore an object of the present invention to provide an electronic energy meter that can deliver power consumption information readings from residential and commercial facilities to electrical utility companies.

It is another object of the present invention to provide an electronic energy meter that provides power consumption information to the electrical utility companies automatically via a remote means.

It is yet another object of the present invention to provide an electronic energy meter that provides power consumption information to the electrical utility companies without involvement of human meter readers and installation of modems and telephone lines.

The present invention provides an electric energy meter for providing real time revenue metering using wireless or cell phone technology. The present invention describes an electrical metering system capable of performing multiple metering functions, collecting data, and wirelessly provides the collected metering data to a utility operator is disclosed. The electrical metering system comprising at least one computing device for initiating a request for data; a first modem for connecting the computing device to an infrastructure; a wireless embedded modem for wirelessly connecting an electric meter to an infrastructure, wherein the wireless electric modem receives a request from the computing device and wirelessly transmits the metering data to the computing device thereby initiating the request.

The present application describes three infrastructure variations herein below. However, additional combinations and variations of the described infrastructure will be understood by those skilled in the art. The invention describes establishing communication between the embedded wireless modem and the computing device over the following infrastructures:

1. The infrastructure comprises a telephone infrastructure including telephone landlines operated by at least one telephone company and a cell phone infrastructure including cell phone relay stations operated by at least one cell service provider. The embedded wireless modem utilizing industry standard interface protocols used within the cell phone industry to communicate with the computing device.

2. The infrastructure comprises a wide area network, e.g., the Internet. The embedded wireless modem utilizing industry standard interface protocols, for example, 802.11a and 802.11b, to communicate with the computing device.

3. The infrastructure further comprises the wide area network and a carrier network infrastructure including a broadcasting means operated by at least one carrier network provider. The embedded wireless modem utilizing industry standard interface protocols selected from General Packet Radio Service (GPRS), Code Division Multiple Access (CDMA), and Wideband Code Division Multiple Access (WCDMA) to communicate with the computing device.

BRIEF DESCRIPTION OF THE DRAWINGS

The present invention is further explained by way of example and with reference to the accompanying drawings, wherein.

DETAILED DESCRIPTION OF THE PREFERRED EMBODIMENTS

The present invention provides an electric energy meter for providing real time revenue metering using wireless or cell phone technology to deliver information to a computing device on a network, e.g., an Internet website, managed by an electrical utility company or its affiliates. The operation of the electric energy meter of the present invention is described in a co-owned U.S. Pat. No. 6,751,563, titled "Electronic Energy meter", the contents of which are incorporated herein by reference.

Figure 5:
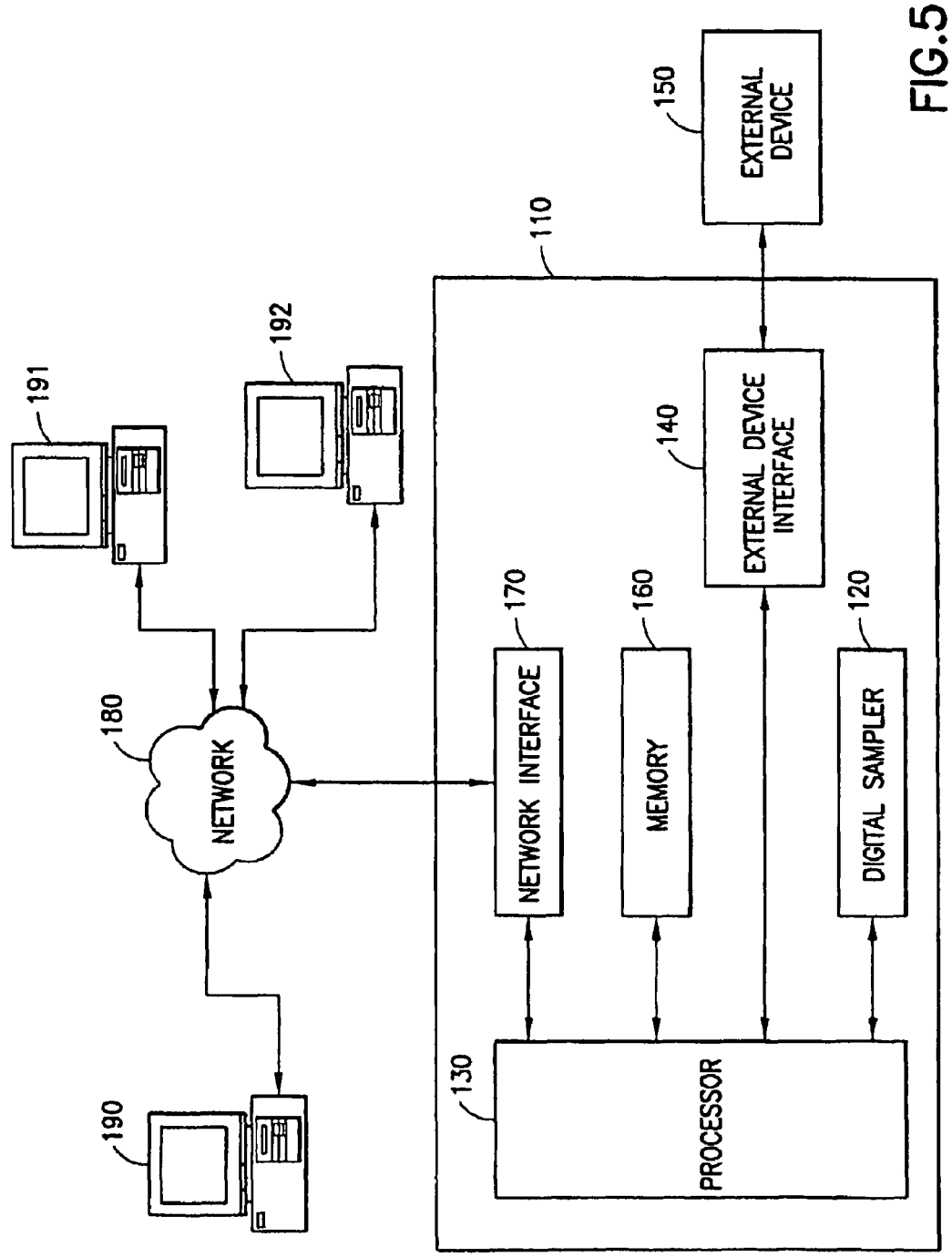
FIG. 5 is a block diagram of a power quality and revenue meter according to an embodiment of the present invention.

Portions of U.S. Pat. No. 6,751,563 will be reproduced here. FIG. 5 is a block diagram of a web server power quality and revenue meter according to an embodiment of the present invention. Shown in FIG. 5 are power quality and revenue meter (meter) 110. The meter is connected to monitor electric distribution power lines (not shown), to monitor voltage and current at the point of connection. Included therein is digital sampler 120 for digitally sampling the voltage and current of the power being supplied to a customer or monitored at the point of the series connection in the power grid. Digital sampler 120 digitally samples the voltage and current. The digital samples are then forwarded to processor 130 for processing. Also connected to processor 130 is external device interface 140 for providing an interface for external devices 150 to connect to meter 110. These external devices might include other power meters, sub-station control circuitry, on/off switches, etc. Processor 130 receives data packets from digital sampler 120 and external devices 150, and processes the data packets according to user defined or predefined requirements. A memory 160 is connected to processor 130 for storing data packets and program algorithms, and to assist in processing functions of processor 130. These processing functions include the power quality data and revenue calculations, as well as formatting data into different protocols which will be described later in detail. Processor 130 provides processed data to network 180 through network interface 170. Network 180 can be the Internet, the World Wide Web (WWW), an intranet, a wide area network (WAN), or local area network (LAN), among others. In the preferred embodiment, the network interface converts the data to an Ethernet TCP/IP format. The use of the Ethernet TCP/IP format allows multiple users to access the power meter simultaneously. In a like fashion, network interface 170 might be comprised of a modem, cable connection, or other devices that provide formatting functions. Computers 190-192 are shown connected to network 180.

A web server program (web server) is contained in memory 160, and accessed through network interface 170. The web server provides real time data through any known web server interface format. For example, popular web server interface formats consist of HTML and XML formats. The actual format of the programming language used is not essential to the present invention, in that any web server format can be incorporated herein. The web server provides a user friendly interface for the user to interact with the meter 110. The user can have various access levels to enter limits for e-mail alarms. Additionally, the user can be provided the data in a multiple of formats including raw data, bar graph, charts, etc. The currently used HTML or XML programming languages provide for easy programming and user friendly user interfaces.

The operation of the device of FIG. 5 will now be described. Digital sampler 120 samples the voltage and current at and flowing through the point of connection, or sampling point. The voltage and current readings, in the form of data packets, are forwarded to processor 130 where they undergo various power calculations. Processor 130 calculates, for example, instantaneous voltage and current, real power, reactive power, and apparent power. The processing algorithms can be preprogrammed into memory 160, uploaded by an end user, or performed at the end-user's location. The calculations performed by processor 130 are not meant to be all inclusive, as the processor can be programmed to provide any number of preprogrammed or user defined calculations. In addition to performing the calculations, processor 130 sends the packet data to memory 160 to be stored for future access. As digital sampler 120 is sampling the voltage and current at the sampling point, external device 150 can be feeding parallel information to processor 130 through external device interface 140. This external device packet data would be processed and stored in a similar manner as the digital sampler packet data. Processor 130 then formats the processed data into various network protocols and formats.

The protocols and formats can, for example, consist of the web server HTML or XML formats, Modbus TCP, RS-485, FTP or e-mail. Dynamic Host Configuration Protocol (DHCP) can also be used to assign IP addresses. The network formatted data is now available to users at computers 190-192 through network 180, that connects to meter 10 at the network interface 170.

In the preferred embodiment of the present invention, network interface 170 is an Ethernet interface that supports, for example, 100 base-T or 10 base-T communications. This type of network interface can send and receive data packets between WAN connections and/or LAN connections and the meter 110. This type of network interface allows for situations, for example, where the web server may be accessed by one user while another user is communicating via the Modbus TCP, and a third user may be downloading a stored data file via FTP. The ability to provide access to the meter by multiple users, simultaneously, is a great advantage over the prior art. This can allow for a utility company's customer service personnel, a customer and maintenance personnel to simultaneously and interactively monitor and diagnose possible problems with the power service.

Figure 6:
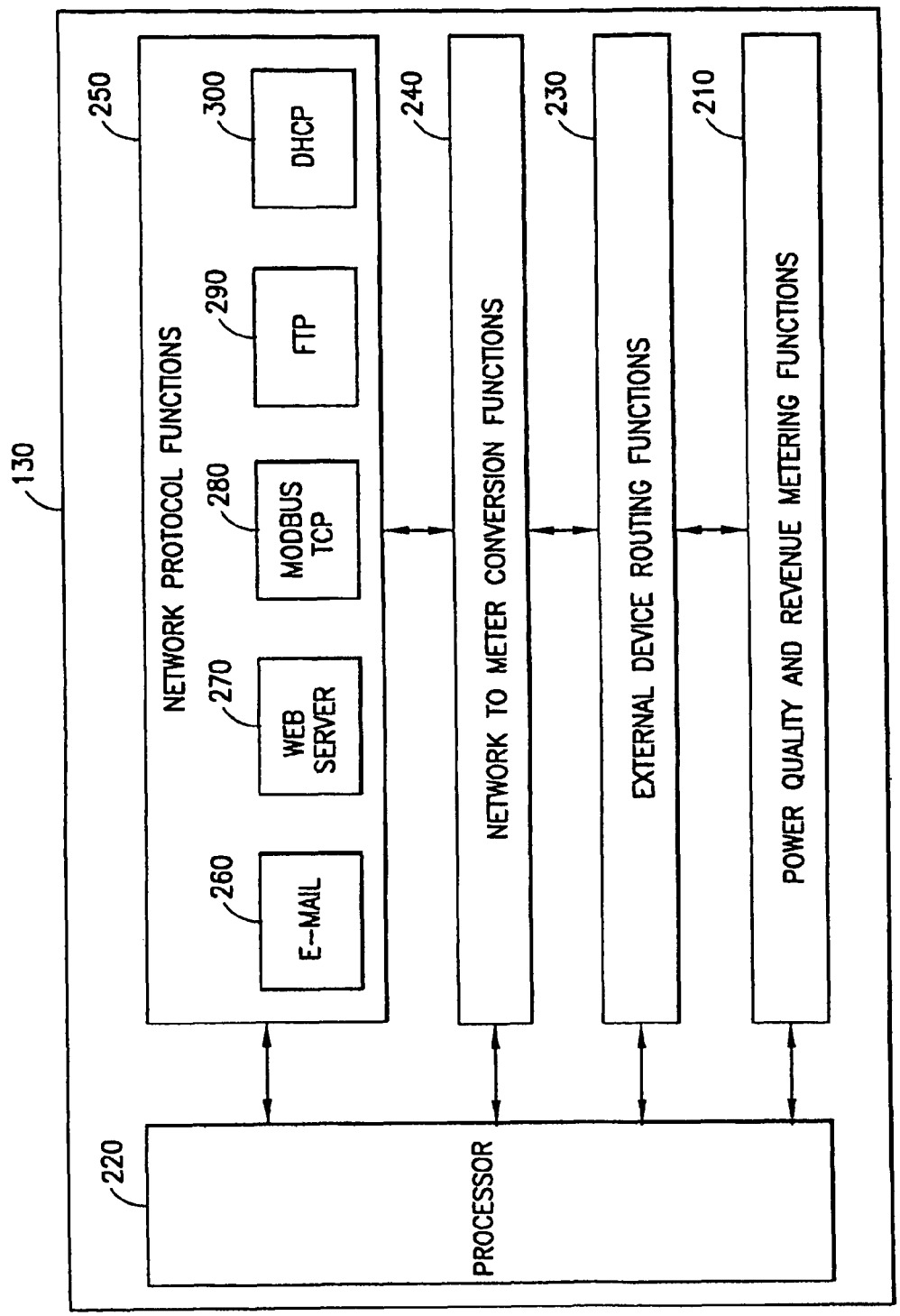
FIG. 6 is a functional block diagram of the processor functions of a power quality and revenue meter system shown in FIG. 5 according to an embodiment of the present invention.

FIG. 6 is a functional block diagram of processor 130 of the web server power quality and revenue meter system according to the embodiment of the present invention. FIG. 6 illustrates the functional processing structure of processor 130. Processor 130 is shown containing four main processing functions. Processing 220 can be realized in various memory configurations, and are not limited to any one configuration. The functions shown are illustrative and not meant to be inclusive of all possible functions performed by processor 130. Power Quality and Revenue Metering functions (metering functions) 210 consists of a complete set of functions which are needed for power quality and revenue metering. Packet data collected by digital sampler 120 is transmitted to processor 130. Processor 130 calculates, for example, power reactive power, apparent power, and power factor. The metering function 210 responds to commands via the network or other interfaces supported by the meter. External Device Routing Functions 230 handle the interfacing between the external device 150 and meter 110. Raw data from external device 150 is fed into meter 110. The external device 150 is assigned a particular address. If more than one external device is connected to meter 110, each device will be assigned a unique particular address.

Referring again to FIG. 5, network interface 170 can support, for example, either 100 base-T or 10 base-T communications, and receives and sends data packet between a wide area network (WAN) connection and/or local area network (LAN) connection and the meter. The Network Protocol Functions of meter 110 are executed by processor 130 which executes multiple networking tasks that are running concurrently. As shown in FIG. 6, these include, but are not limited to, the following network tasks included in network protocol functions 250: e-mail 260, web server 270, Modbus TCP 280, FTP 290, and DHCP 300. The e-mail 260 network protocol function can be utilized to send e-mail messages via the network 180 to a user to, for example, notify the user of an emergency situation or if the power consumption reaches a user-set or pre-set high level threshold.

As the processor receives packets of data it identifies the network processing necessary for the packet by the port number associated with the packet. The processor allocates the packet to a task as a function of the port number. Since each task is running independently the meter 110 can accept different types of requests concurrently and process them transparently from each other. For example, the web server may be accessed by one user while another user is communicating via Modbus TCP and at the same time a third user may download a log file via FTP.

The Network to Meter Protocol Conversion Function 240 is used to format and protocol convert the different network protocol messages to a common format understood by the other functional sections of meter 110. After the basic network processing of the packet of data, any "commands" or data which are to be passed to other functional sections of meter 110 are formatted and protocol converted to a common format for processing by the Network to Meter Protocol Conversion Function 240. Similarly, commands or data coming from the meter for transfer over the network are pre-processed by this function into the proper format before being sent to the appropriate network task for transmission over the network. In addition this function first protocol converts and then routes data and commands between the meter and external devices.

Numerous types of wireless Ethernet connections can be used to perform the objects of the present invention. These types can be classified in terms of the type of a connection to the network and the configuration and capability of the utility revenue meter. In general, the proposed implementation can be used on any network that includes wireless modems. The following are some examples of proposed configurations.

Dial-Up Connection

Figure 1:
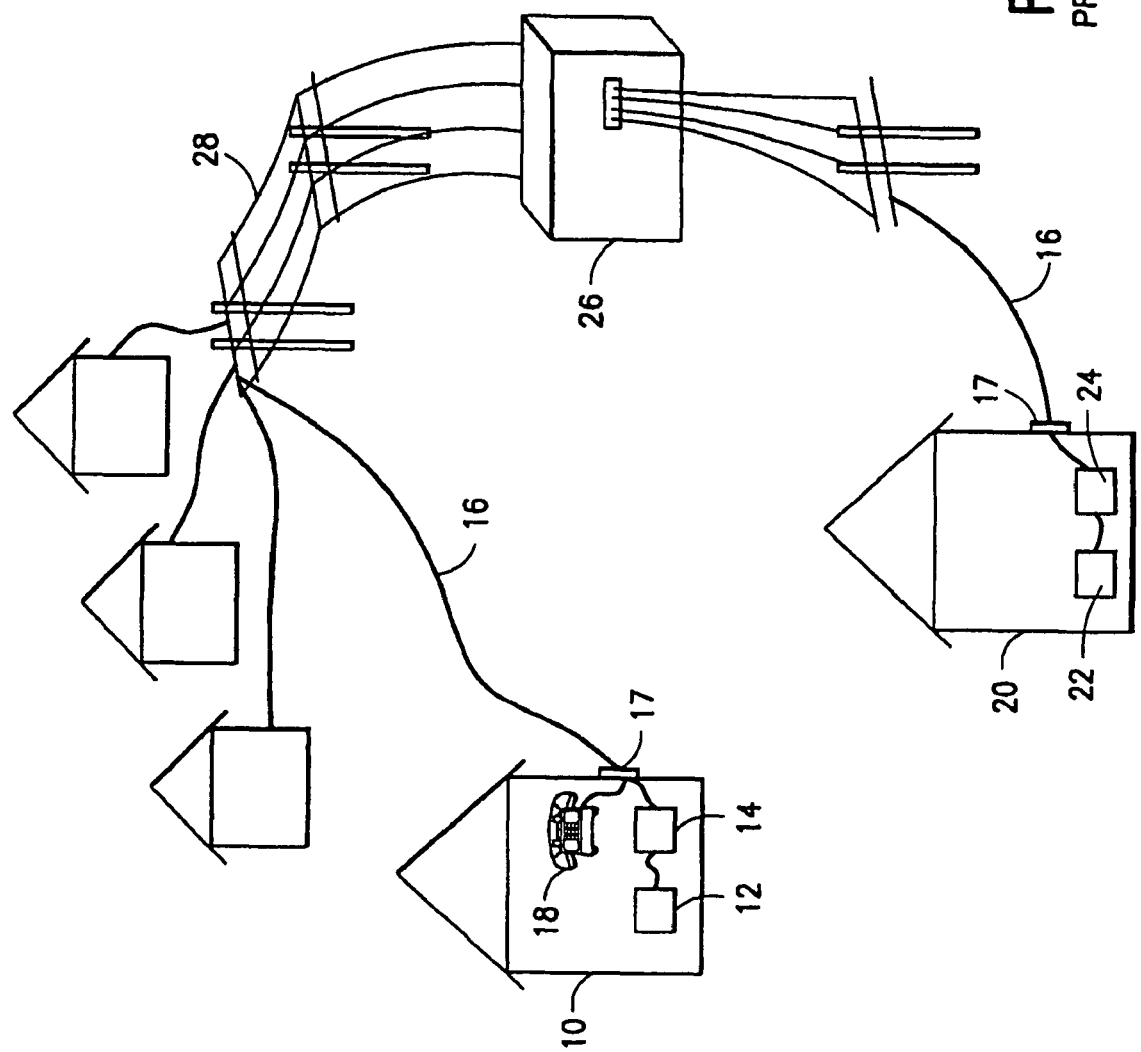
FIG. 1 is a diagram of interconnectivity between an energy meter and a utility for the purpose of collecting power usage data according to prior art.
Figure 2:
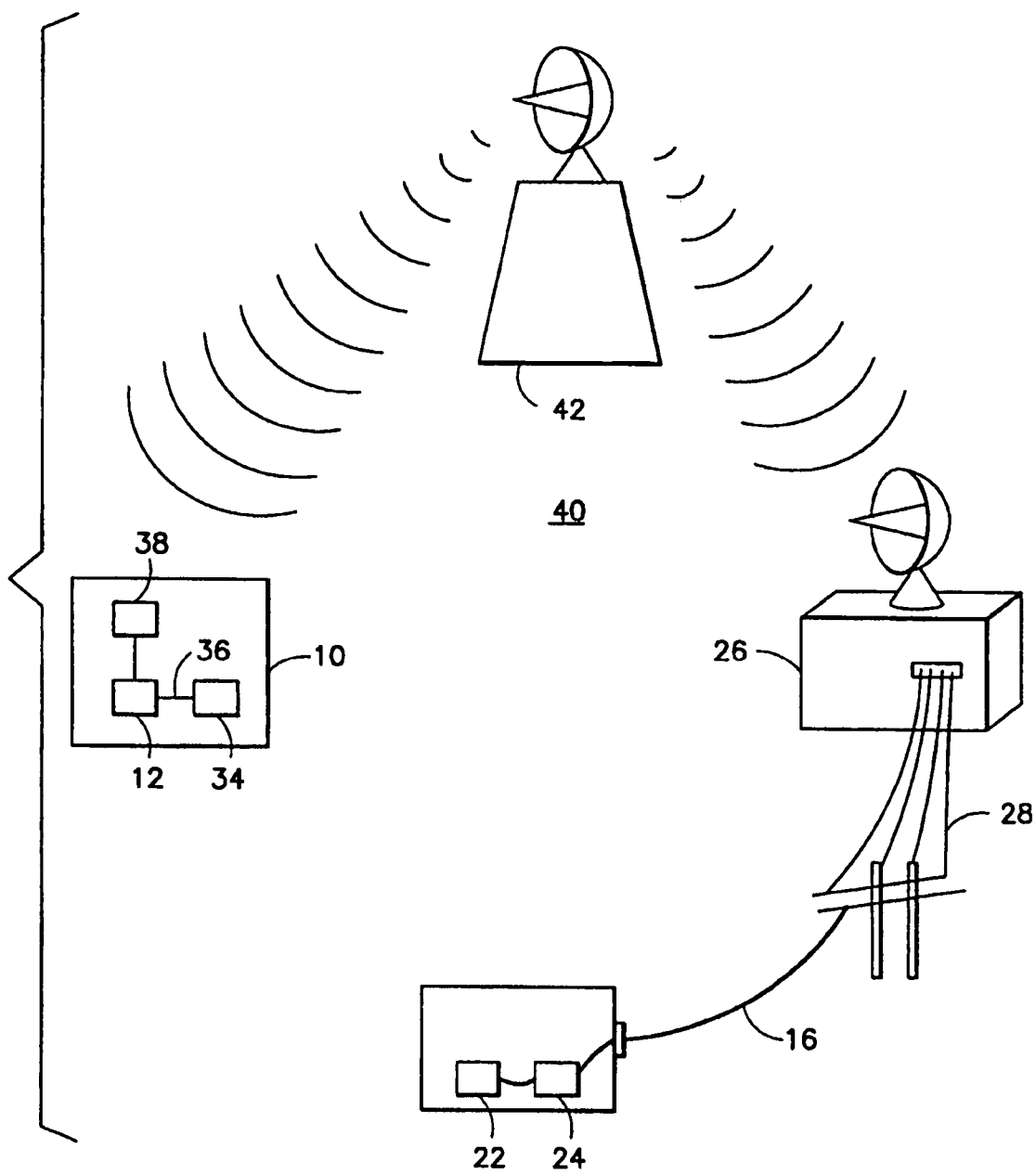
FIG. 2 is a diagram of interconnectivity between an energy meter and a utility for the purpose of collecting power usage data, using the telephone and a cell phone infrastructures, according to the present invention.

FIG. 2 illustrates a computing device 22, e.g., a computer or a hand held wireless device that may be used to retrieve information form a revenue meter 12. A revenue meter 12 is located within or outside a house or an institution 10 for metering utility provided resources, e.g., electrical power. A connection between the computing device 22 and the revenue meter 12 may be established via a dial-up using wired lines 28, such as a telephone infrastructure and wireless cell technology. A telephone infrastructure or grid 28, managed by a telephone company 26 may be used together with the wireless grid infrastructure 40 including Cell Relay stations 42 managed by a cell phone service provider. It is noted that the telephone infrastructure or grid 28 may be discarded where the computing device 22 has direct access to the wireless grid infrastructure 40.

The computing device 22 may be located anywhere the telephone and cell infrastructures 26 and 40 reaches. This may be on the premises of a utility company itself or at any department or agency entrusted with receiving meter readings. The connection between the computing device 22 and the revenue meter 12 may be established via a dial-up process using a wireless modem 34 to respond to a signal from the computing device 22 relayed by a cell relay station 42.

The wireless embedded modem 34 can communicate with the revenue meter via hard wired communication means 36, such as, a serial connection, the Ethernet, a universal serial bus (USB), and a faster version of USB, USB2, or using wireless means, for example, 802.11 and similar protocols. The meter peripheral device's 38 communicates with the revenue meter 12 via industry standard communication protocols, such as, Modbus remote terminal unit (RTU) from the Modicon Inc., DNP etc., so that the meter peripheral device 38 can act as a server for any revenue meters 12 utilizing industry standard interfaces and protocols. The peripheral device 38 presents the collected meter readings and data to the wireless modem 34 to be forwarded to the computing device 22 using a browser program.

The revenue meter 12 or a peripheral device 38 attached to the revenue meter manage the wireless modem 34, e.g., controlling the modem's readiness for a dial-up session established by the computing device 22. Additionally, the revenue meter 12 or the peripheral device 38 may be accessed via the wireless modem 34 and used as a server for providing revenue meter's readings and other relevant data to the computing device 22. An interface program, e.g., a browser may be used on the revenue meter 12 or the peripheral device 38 to send and receive data.

In this mode, after the connection between the embedded wireless modem 34 and the computing device 22 is established, the revenue meter 32 or the meter peripheral device 38 control the embedded wireless modem 34 maintaining its readiness for a dial-up session. Such a session may be initiated by the computing device 42 at any time.

Wireless Packet Data Connection

Figure 3:
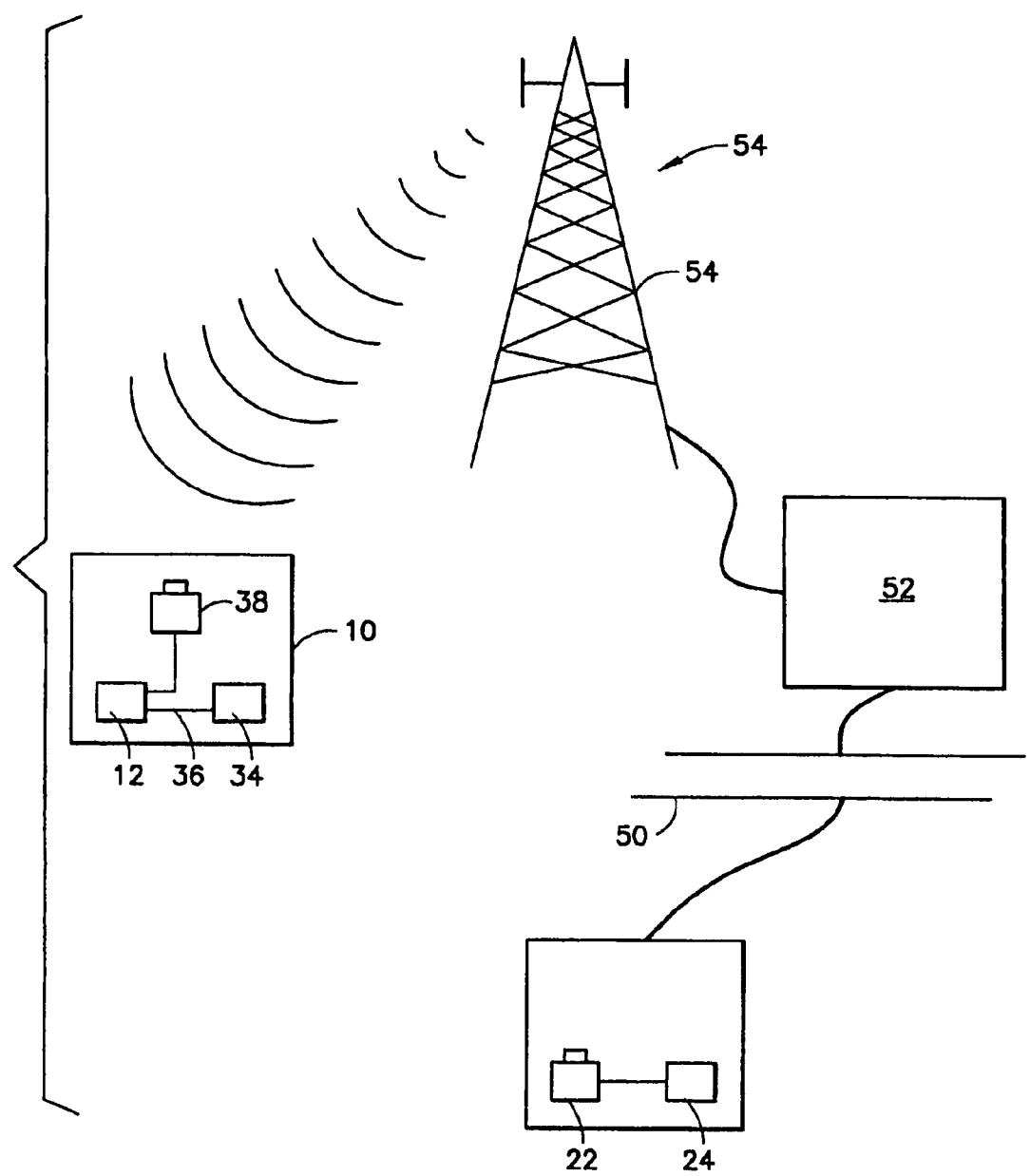
FIG. 3 is a diagram of interconnectivity between an energy meter and a utility for the purpose of collecting power usage data, using the Internet and a carrier network infrastructures, according to the present invention.

In another embodiment of the invention illustrated in FIG. 3, the wireless modem 34 communicates with the computing device 22 via a carrier network 54 using various protocols, e.g., a General Packet Radio Service (GPRS), Code Division Multiple Access (CDMA), Wideband Code Division Multiple Access (WCDMA) etc., to provide the revenue meter information collected by the revenue meter 12. In this embodiment, the carrier network 54 is utilized in conjunction with packet data networks, such as the Internet.

A connection between computing device 22, e.g., a computer or a hand held wireless device and the revenue meter 12 may be established via a carrier network 54. The computing device 22 uses a dial-up modem 24 or some other means to access an Internet service provider (ISP) and a common browser program, e.g., a Microsoft Explorer, to connect to the Internet 50, and through it to the carrier network 54. The dial-up modem 24 can be a digital subscriber line (DSL) modem or a cable modem and can connect to the Internet via the cable, satellite, or the telephone infrastructure, including hot spots located within appropriate distance from the modem 24. The modem 24 may be built into the computing device 22.

The carrier network 54 may include a carrier network provider facility 52, a broadcasting means 56, e.g., a broadcasting tower, a satellite, etc., and some means of access to the Internet 50. The computing device 22 may be located anywhere, the only requirement is that it has an ability and means to connect to the Internet 50. The computing device 22 may be located on the premises of a utility company itself or at any department or agency entrusted with receiving meter readings.

A request for information from the computing device 22 is forwarded over the Internet 50 to the carrier network provider facility 52, where the request is processed and transmitted via the broadcasting means 56 to the wireless embedded modem 34. The wireless embedded modem 34 can communicate with the revenue meter via hard wired communication means 36, such as, a serial connection, the Ethernet, a universal serial bus (USB), and a faster version of USB, USB2, or using wireless means, for example, 802.11 and similar protocols.

The revenue meter 12 or a peripheral device 38 attached to the revenue meter, manages the wireless modem 34, e.g., control the modem's readiness to send information to the computing device 22. Additionally, the revenue meter 12 or the peripheral device 38 may perform as a server for providing revenue meter's readings and other relevant data to the computing device 22. An interface program, e.g., a browser, may be used to send and receive data.

Hot Spots

Figure 4:
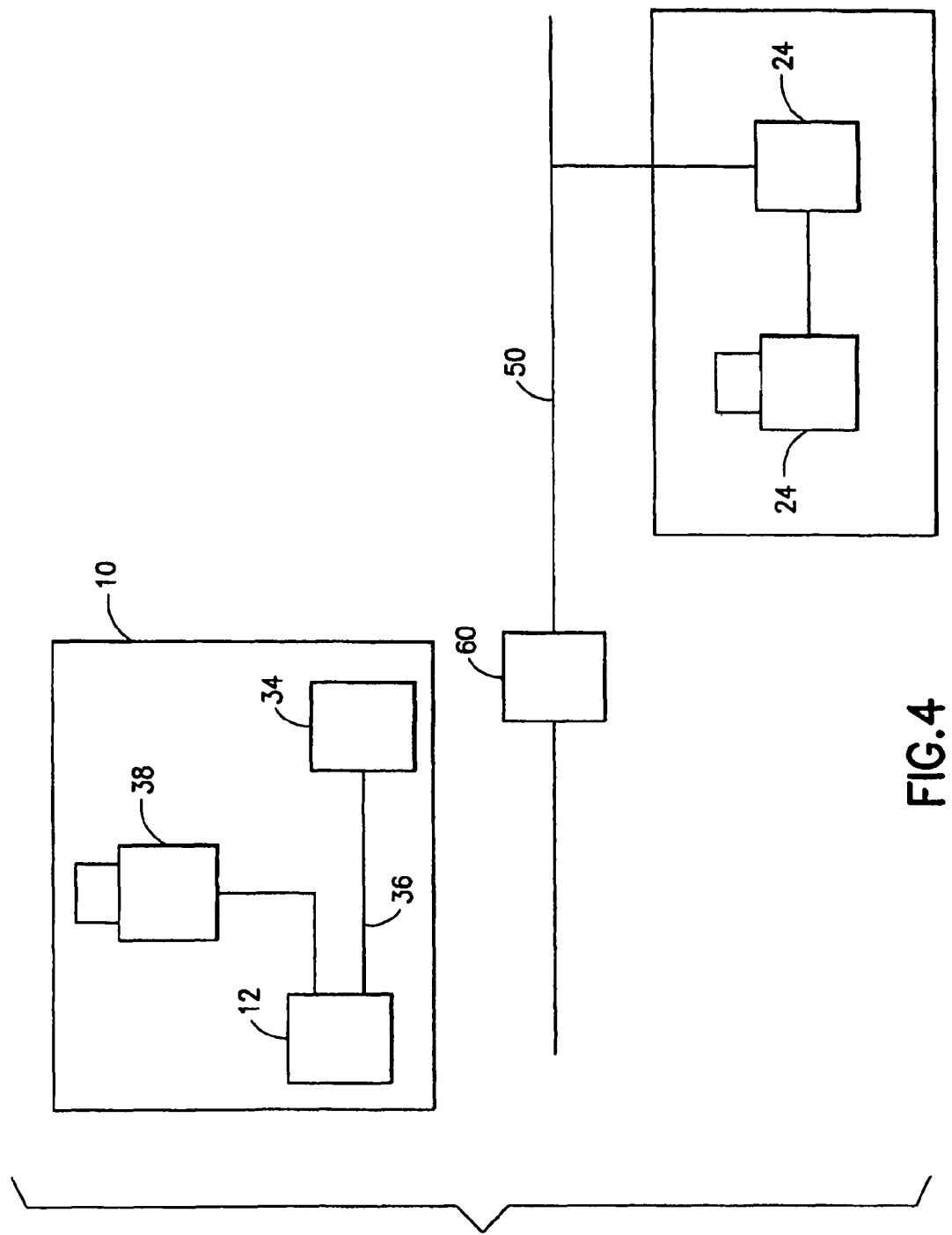
FIG. 4 is a diagram of interconnectivity between an energy meter and a utility for the purpose of collecting power usage data, using the Internet infrastructure, according to the present invention.

In another embodiment of the invention illustrated in FIG. 4, the wireless modem 34 communicates with the computing device 22 via the Internet 50 to provide information collected by the revenue meter 12. In this embodiment, the wireless modem 34 is accessed via a wireless access point (802.11a or b) called a hot spot 60, which covers a specific geographic boundary. The hot spots are usually set up for Internet access by devices with wireless connectivity. Hot spots can be located just about anywhere, and the maximum connectivity distance is being constantly improved.

Although the illustrative embodiments of the present disclosure have been described herein with reference to the accompanying drawings, it is to be understood that the disclosure is not limited to those precise embodiments, and that various other changes and modifications may be affected therein by one skilled in the art. That is, those skilled in the art will envision other modifications within the scope and spirit of the claims appended hereto.

What is claimed is:

1. An electrical metering system capable of performing multiple metering functions, collecting data, and wirelessly providing the collected metering data to a utility operator, the electrical metering system comprising:
   at least one computing device for initiating a request for data;
   a first modem for connecting the computing device to an infrastructure; and
   at least one electric meter comprising:
   a digital sampler configured for sampling voltage and current waveforms;
   at least one processor configured to collect the voltage and current data and generate power consumption data from the sampled voltage and current waveforms, wherein the at least one processor is configured to act as a server for the at least one electric meter and is further configured for presenting the collected and generated data in the form of web pages; and
   a wireless embedded communications device coupled to the at least one processor and for wirelessly connecting the at least one electric meter to the infrastructure,
   wherein the wireless embedded communications device receives a request from the computing device and wirelessly transmits the collected and generated metering data to the computing device initiating the request, wherein the computing device accesses the collected and generated data via a software program.

2. The system of claim 1, wherein the infrastructure comprises a telephone infrastructure including telephone landlines coupled to the at least one computing device and a cell phone infrastructure including cell phone relay stations coupling the telephone infrastructure to the wireless embedded modem.

3. The system of claim 1, wherein the infrastructure comprises a wide area network.

4. The system of claim 3, wherein the infrastructure further comprises a carrier network infrastructure including a broadcasting means operated by at least one carrier network provider.

5. The system of claim 3, wherein the wide area network is the Internet.

6. The system of claim 1, wherein the computing device is selected from one of a desktop personal computer, a laptop computer, a cell phone, a hand held computing device.

7. The system of claim 6, wherein the computing device uses a web browsing program to initiate the request for data.

8. The system of claim 1, further comprising a communication means for connecting the wireless embedded communications device to the at least one processor, the communication means being selected from hard wired or wireless means.

9. The system of claim 8, wherein the hard wired means is selected from one of a serial connection, the Ethernet, and a universal bus (USB).

10. The system of claim 8, wherein the wireless means utilizes 802.11 protocol.

11. The system of claim 1, wherein the at least one processor utilizes metering protocols selected from Modbus remote terminal unit (RTU) and DNP to communicate to the wireless embedded communications device of the at least one electric meter.

12. The system of claim 1, wherein the embedded wireless communications device utilizing industry standard interface protocols are selected from General Packet Radio Service (GPRS), Code Division Multiple Access (CDMA), and Wideband Code Division Multiple Access (WCDMA) to communicate.

13. The system of claim 1, wherein the embedded wireless communications device utilizes a 802.11 protocol to communicate.

14. The system of claim 1, wherein the embedded wireless communications device utilizing industry standard interface protocols used with the cell phone industry to communicate.

15. The system of claim 3, wherein the wide area network is Ethernet-based.

16. The system of claim 15, wherein the wide area network uses Dynamic Host Configuration Protocol (DHCP) to assign an IP address to the modem.

17. The system of claim 3, wherein the wide area network includes at least one wireless access point and the communications device connects to the infrastructure via the at least one wireless access point.

18. The system of claim 1, wherein the infrastructure is a wide area network operating on TCP/IP.

19. The system of claim 18, wherein the server provides data to the wide area network in Hypertext Markup Language (HTML) or Extensible Markup Language (XML).

20. A method for performing multiple metering functions, collecting data, and wirelessly providing the collected metering data to a utility operator, the method comprising the steps of:
connecting at least one computing device to an infrastructure;
initiating a request for data from the computing device;
receiving the request in a wireless embedded communications device coupled to the infrastructure, the wireless embedded communications device coupled to an electric meter including at least one processor for collecting and generating power consumption information;
transmitting the request to the at least one processor;
generating web pages of the power consumption information in the at least one processor;
establishing a connection with the computing device over the infrastructure,
wherein the wireless embedded communications device wirelessly transmits the web pages to the computing device.

21. The method of claim 20, wherein the infrastructure is selected from
(a) a telephone infrastructure including telephone landlines and a cell phone infrastructure including cell phone relay stations;
(b) a wide area network; and
(c) the wide area network and a carrier network infrastructure including a broadcasting means operated by at least one carrier network provider.

22. A meter for measuring and monitoring electrical energy, the meter comprising:
a digital sampler configured for sampling voltage and current waveforms;
at least one processor configured to collect the voltage and current data and generate power consumption data from the sampled voltage and current waveforms;
a wireless embedded communications device configured for transmitting the data to a computing device residing on an infrastructure; and
wherein the at least one processor acts as a server for the meter in managing the metering data and the connection between the computing device, wherein the server provides data to the computing device in Hypertext Markup Language (HTML) or Extensible Markup Language (XML) and the computing device accesses the meter via a software program
wherein the wireless embedded communications device communicates to the at least one processor via an industrial metering protocol.

23. The meter of claim 22, wherein the wireless embedded communications device operates on a 802.11 protocol.

24. The meter of claim 22, wherein the wireless embedded communications device operates on a protocol selected from the group consisting of General Packet Radio Service (GPRS), Code Division Multiple Access (CDMA), and Wideband Code Division Multiple Access (WCDMA).

25. The meter of claim 22, wherein the wireless embedded communications device operates on a cell phone protocol.

26. The meter of claim 22, wherein the infrastructure is a wide area network.

27. The meter of claim 26, wherein the wide area network is Ethernet-based.

28. The meter of claim 27, wherein the wide area network uses Dynamic Host Configuration Protocol (DHCP) to assign an IP address to the wireless embedded communications device.

29. The meter of claim 27, wherein the wide area network includes at least one wireless access point and the wireless embedded communications device connects to the infrastructure via the at least one wireless access point.

30. The meter of claim 26, wherein the infrastructure is a wide area network operating on TCP/IP.

31. The meter of claim 26, wherein the industrial metering protocol is Modbus or DNP.

32. A meter for measuring and monitoring electrical energy, the meter comprising:
a digital sampler configured for sampling voltage and current waveforms;
at least one first processor configured to collect the voltage and current data and generate power consumption data from the sampled voltage and current waveforms; and
a wireless embedded communications device configured for transmitting the data to a computing device residing on an infrastructure, wherein the wireless embedded communications device includes at least one second processor configured to act as a server for the meter in managing the metering data and the connection between the computing device, wherein the server provides data to the computing device in the form of web pages and the computing device accesses the meter via a software program;
wherein the at least one second processor of the wireless embedded communications device communicates to the at least one first processor via an industrial metering protocol.

33. An electrical metering system capable of performing multiple metering functions, collecting data, and wirelessly providing the collected metering data to a utility operator, the electrical metering system comprising:

at least one computing device for initiating a request for data;

a first modem for connecting the computing device to an infrastructure; and at least one electric meter comprising:

a digital sampler configured for sampling voltage and current waveforms;

at least one processor configured to collect the voltage and current data and generate power consumption data from the sampled voltage and current waveforms, wherein the at least one processor is configured to act as a server for the at least one electric meter and is further configured for presenting the collected and generated data in the form of web pages; and a wireless communications device coupled to the at least one processor and for wirelessly connecting the at least one electric meter to the infrastructure, wherein the wireless communications device receives a request from the computing device and wirelessly transmits the collected and generated metering data to the computing device initiating the request, wherein the computing device accesses the collected and generated data via a software program.

34. A meter for measuring and monitoring electrical energy, the meter comprising:

a digital sampler configured for sampling voltage and current waveforms;

at least one processor configured to collect the voltage and current data and generate power consumption data from the sampled voltage and current waveforms;

a wireless embedded communications device configured for transmitting the data to a computing device residing on an infrastructure; and wherein the at least one processor acts as a server for the meter in managing the metering data and the connection between the computing device, wherein the server provides data to the computing device in Hypertext Markup Language (HTML) or Extensible Markup Language (XML) and the computing device accesses the meter via a software program;

wherein the wireless embedded communications device is coupled to the at least one processor.

* * * * *